United States Patent [19]

Sellers et al.

[11] Patent Number: 5,698,980
[45] Date of Patent: Dec. 16, 1997

[54] GRADIENT COIL MOUNTING METHOD AND ARRANGEMENT FOR REDUCING NOISE IN A MAGNETIC RESONANCE IMAGING APPARATUS

[75] Inventors: Michael Sellers, Erlangen; Johann Schuster, Oberasbach; Franz Boemmel, Erlangen, all of Germany

[73] Assignee: Siemens Aktiengesellschaft, Munich, Germany

[21] Appl. No.: 689,655

[22] Filed: Aug. 13, 1996

[30] Foreign Application Priority Data

Aug. 24, 1995 [DE] Germany ............... 19531216

[51] Int. Cl.$^6$ ....................................... G01V 3/00
[52] U.S. Cl. ............................ 324/318; 324/319
[58] Field of Search ...................... 324/318, 322, 324/319, 320, 300, 306, 307, 309; 128/653.5

[56] References Cited

U.S. PATENT DOCUMENTS

| | | | |
|---|---|---|---|
| 4,755,754 | 7/1988 | Sireul et al. | 324/318 |
| 5,084,676 | 1/1992 | Saho et al. | 324/318 |
| 5,309,105 | 5/1994 | Sato et al. | 324/318 |
| 5,331,281 | 7/1994 | Otsuka | 324/318 |
| 5,345,177 | 9/1994 | Sato et al. | 324/318 |

FOREIGN PATENT DOCUMENTS

| | | |
|---|---|---|
| 0 350 640 | 1/1990 | European Pat. Off. |
| WO 86/07459 | 12/1986 | WIPO |

*Primary Examiner*—Louis M. Arana
*Attorney, Agent, or Firm*—Hill, Steadman & Simpson

[57] ABSTRACT

In a method for reducing noise during operation of a magnetic resonance apparatus, a gradient coil which exhibits a vibratory node during operation of the apparatus is attached to a holder exclusively in a region of the vibratory node. In a magnetic resonance apparatus, a gradient coil having at least one vibratory node along a longitudinal length thereof during operation of the magnetic resonance apparatus is attached to the holder exclusively in a region of the vibratory node.

5 Claims, 3 Drawing Sheets

5,698,980

GRADIENT COIL MOUNTING METHOD AND ARRANGEMENT FOR REDUCING NOISE IN A MAGNETIC RESONANCE IMAGING APPARATUS

BACKGROUND OF THE INVENTION

1. Field of the Invention

The present invention is directed to a mounting arrangement for a gradient coil, as well as to a method for mounting a gradient coil, for reducing noise in a magnetic resonance imaging apparatus, and in particular to such a method and arrangement wherein at least one gradient coil is secured to a holder.

2. Description of the Prior Art

A magnetic resonance apparatus has a plurality of gradient coils that are arranged on a (superconductive) magnet, such as the exterior of the cryostat. These gradient coils each generate a magnetic field with a linear gradient, which is essential for generating image signals. Three gradient coils are normally provided, respectively generating linear magnetic field gradients during operation of the magnetic resonance apparatus that are directed perpendicular to one another. The directions of these gradients are usually indicated as the x, y and z axis of a Cartesian coordinate system. The gradient coils are glued to a stiff, cylindrical member with an epoxy resin to that they form a union that, fashioned as a tube, can accept an examination subject. A disadvantage of this arrangement is that the gradient coils are subjected to physical forces that are known as Lorentz forces which result from the current supplied to the gradient coils and from the static magnetic field (Bz). The force vectors (FIG. 1) are established by $\vec{F} = \vec{J} \times \vec{B}$, whereby $\vec{J}$ indicates the strength of the current and $\vec{B}$ indicates the field strength. The direction of these forces at a typical x- (or y-) gradient coil is shown as an example for one current direction in FIG. 1. It can be seen from FIG. 1 that the combination of these forces leads to a bending of at least the respective gradient coil. In normal image sequences, the gradient coils are charged with a pulsed current that varies with respect to amplitude and frequency. These oscillating currents generate disadvantageously oscillating Lorentz forces from which vibrations of the gradient coils result. The amplitude of these vibrations is dependent on the operating mode and on the distribution of the forces resulting therefrom and leads to antinodes at, for example, the middle region and end regions and to vibratory nodes at approximately ⅓ and ⅔ the length of the gradient coil system (FIG. 1).

Analyses have shown that the amplitudes of the vibrations in this type of vibratory mode are approximately ten times higher than those in other types of vibratory mode. Such vibrations have a number of negative properties, for example acoustic noises (air-borne sound) that emanate from the gradient coil members, structural noises (structure-borne sound) that emanate from the gradient coils and are transmitted onto the entire system via the fastenings, as well as disruptions of the image quality that can be caused by excessive movement of the gradient coils. As a result of the trend of desiring to operate imaging systems with faster and faster image frequencies, i.e. with more rapid pulse sequences, the vibrations and noises thus also increase, this being undesirable.

SUMMARY OF THE INVENTION

It is an object of the present invention to fasten the gradient coils such that the vibrations emanating from them do not disadvantageously influence the magnetic resonance system.

Another object of the present invention is to provide a method for reducing vibrations arising in the operation of a magnetic resonance imaging system.

Most earlier solutions apply design techniques that increase the rigidity of the system. Recently, the gradient coils were usually secured at their ends, where the vibratory amplitudes are relatively, high. Vibration dampers were thus necessary that reduce the transmission of these vibrations onto the magnetic resonance system. Without these vibration dampers, resonant phenomena can loosen the gradient coils from their holder, which can lead to an undesirable de-adjustment of the gradient coils.

The above object is achieved in accordance with the principles of the present invention in a gradient coil mounting arrangement for a magnetic resonance imaging apparatus wherein the gradient coil is secured to a holder exclusively in a region along a longitudinal length of the gradient coil at which a vibratory node is expected to occur during operation of the apparatus.

The above object is also achieved in a method for reducing noise in a magnetic resonance imaging apparatus, the noise being reduced by mounting at least one gradient coil to a holder exclusively in a region along the longitudinal length of the gradient coil at which a vibratory node is expected to occur during operation of the imaging apparatus.

In the method and arrangement, the gradient coil can be secured to the holder by means of a damping element. The gradient coil can be secured to the holder in a region between ⅓ and ⅔ of the longitudinal length of the gradient coil.

In systems employing more than one gradient coil, each of the gradient coils can be attached to the holder exclusively at a region at which vibratory nodes for the entire gradient coil system are expected to occur during operation.

An advantage of the invention is that, due to the fastening of the gradient coil exclusively in the region of a vibratory node which is expected to occur during operation, practically no vibrations are then transmitted onto the remaining magnetic resonance system, due to a cancellation of forces.

In order nonetheless to damp slight vibrations amplitudes that may possibly arise, a damping element via which the gradient coil is secured to the holder can be advantageously provided in the region of the vibratory nodes.

The gradient coil or gradient coil system, is preferably secured in the region of between ⅓ and ⅔ of the length thereof. When a number of gradient coils are provided, it is advantageous to secure the fastenings in the region of the vibratory nodes of the overall vibratory system.

DESCRIPTION OF THE PREFERRED EMBODIMENTS

Figure 1:
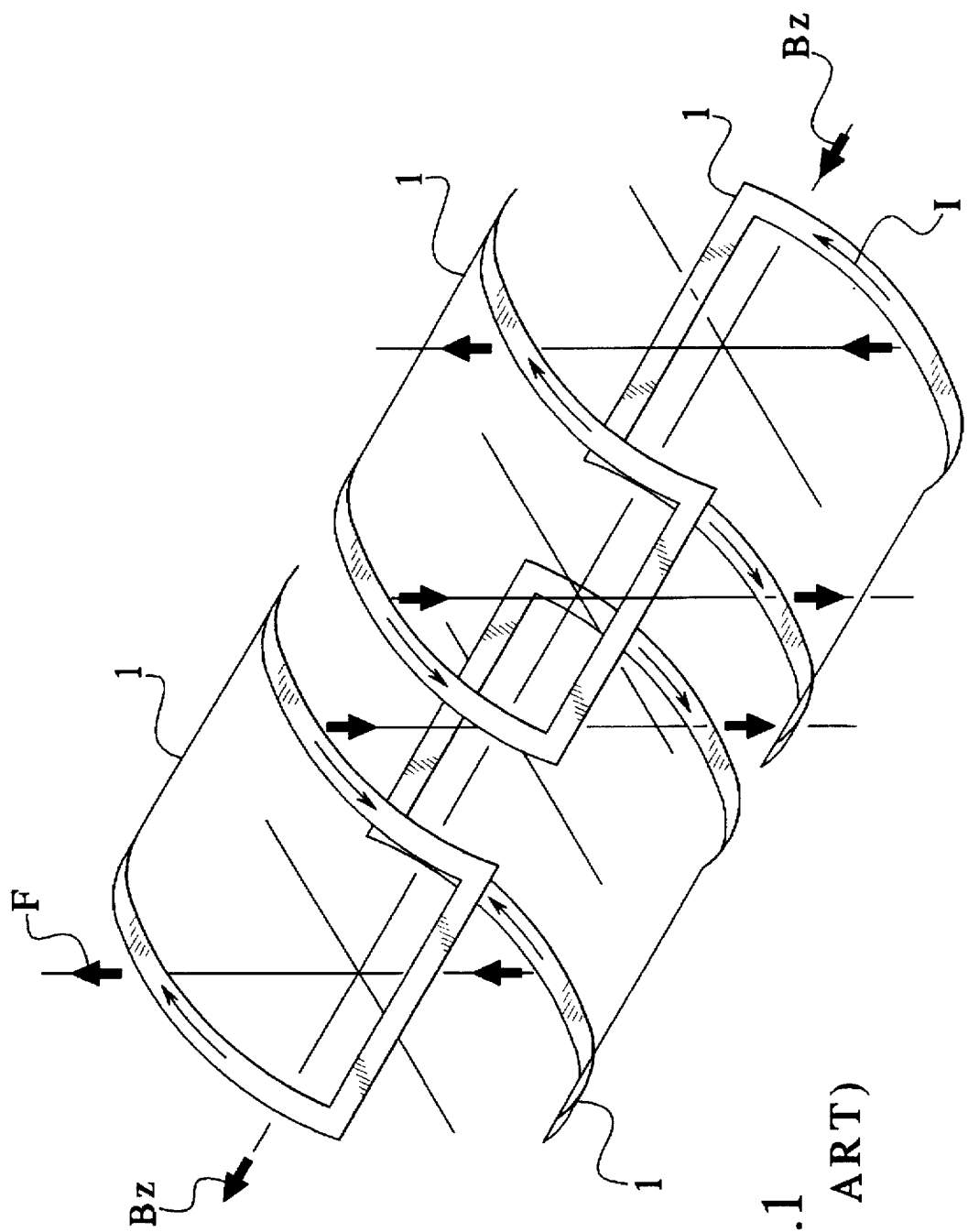
FIG. 1 is a perspective view of a conventional gradient coil arrangement.
Figure 2:
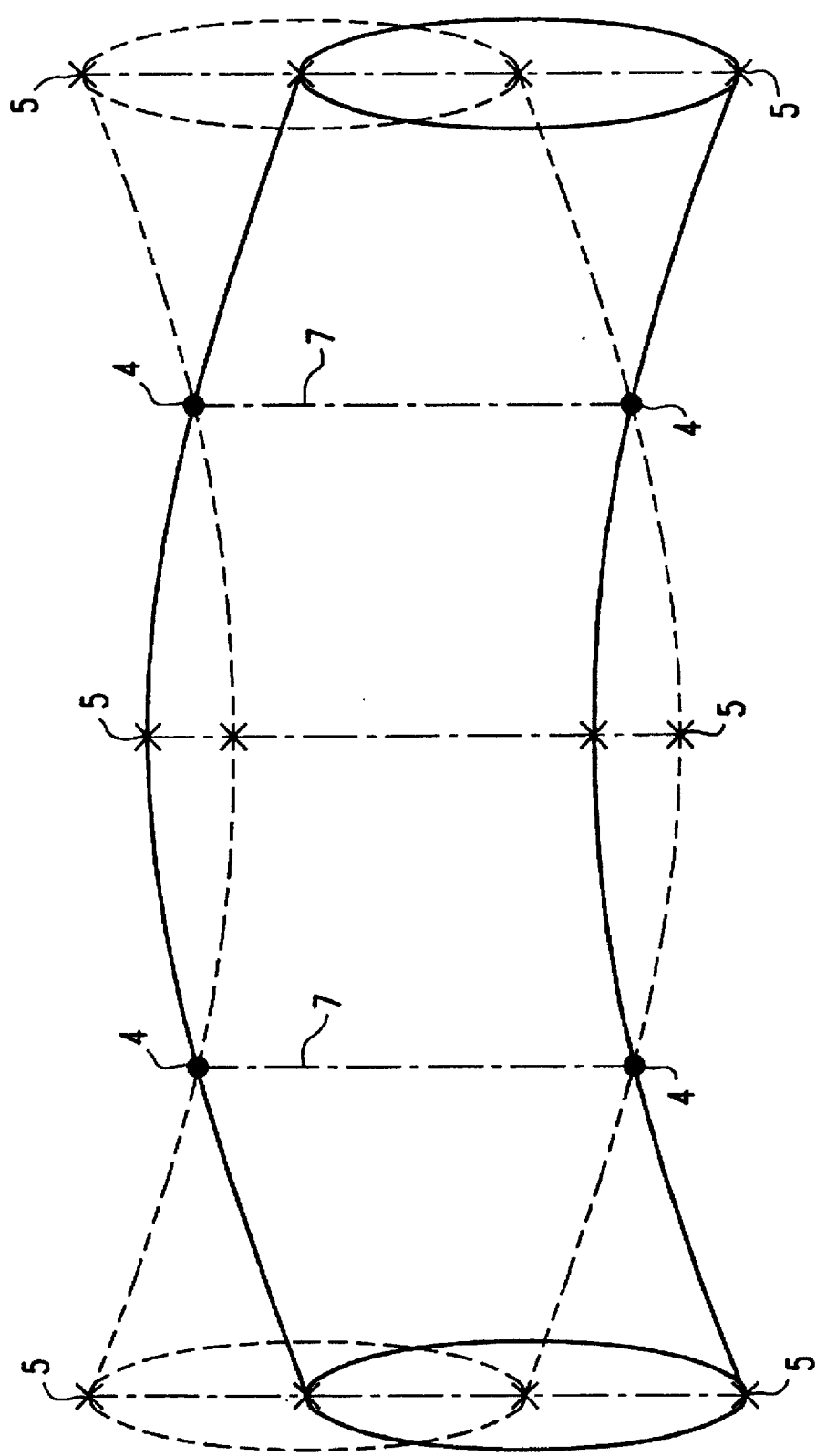
FIG. 2 illustrates the antinodes and vibratory nodes of a vibrating gradient coil system of the type shown in FIG. 1.
Figure 3:
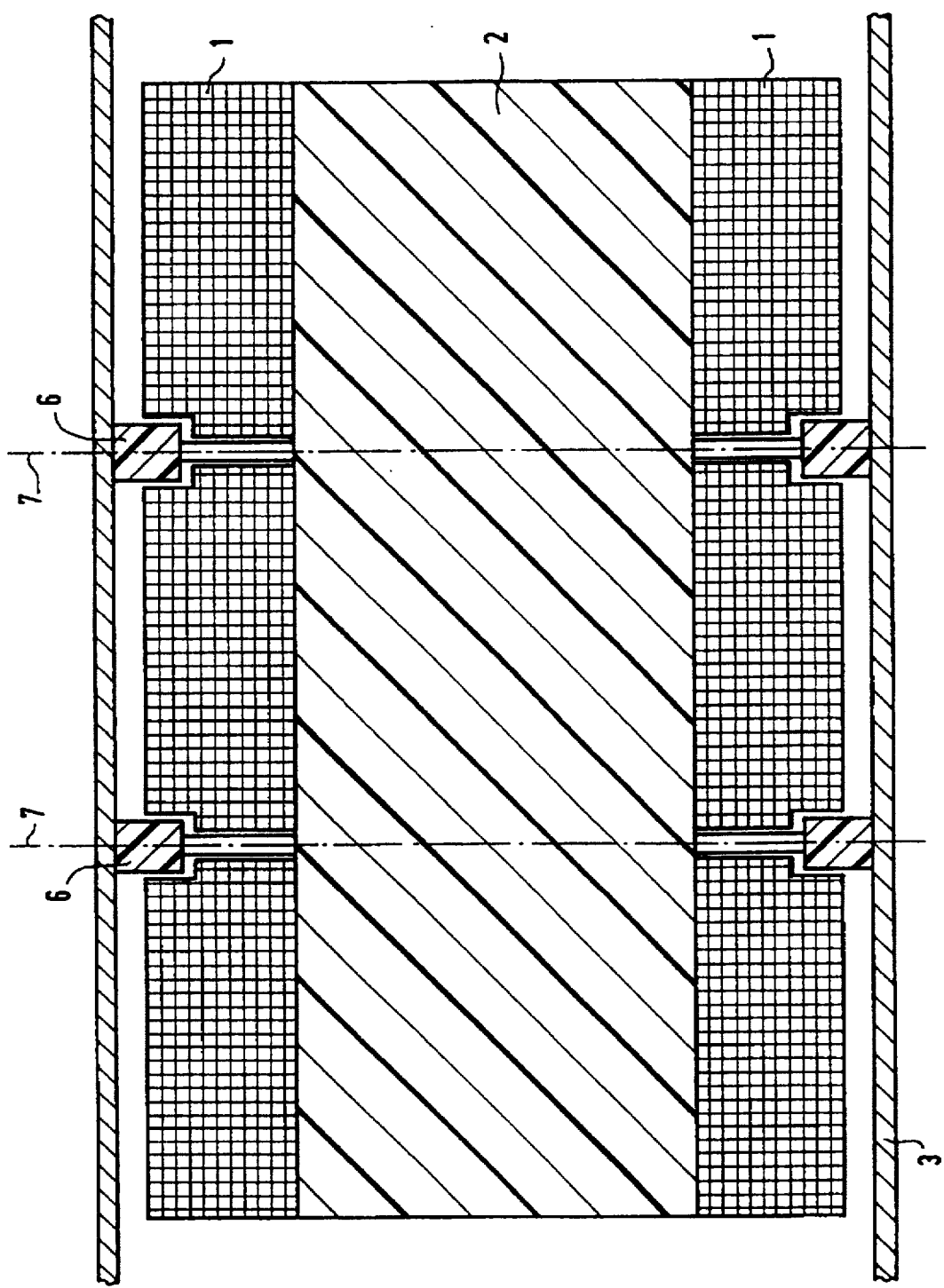
FIG. 3 is a longitudinal section through a gradient coil system of the type shown in FIG. 1 fastened to a holder in accordance with the principles of the present invention.

In FIG. 3, gradient coils are identified with reference character 1. These gradient coils 1 are usually joined via a synthetic resin 2 to form an overall system that, for example, forms a cylinder 3 for the acceptance of a patient to be examined. Inventively, at least the gradient coil system formed by the gradient coils 1 is secured in the region of the vibratory nodes 4 (FIG. 2) which are expected to occur during operation. Vibration maxima 5 can be seen in FIG. 2 as occurring in the regions of the ends and in the middle part of the gradient coil system 1. According to the invention, the gradient coil system 1 can be mounted via a damping element 6, preferably at least in the region of an imaginary line 7 connecting the vibratory nodes 4.

Each individual gradient coil can be secured in the region of the vibratory nodes which are expected to occur for that gradient coil during operation. The fastening regions for the gradient coil system as well as for a gradient coil can, for example, lie in the region between ⅓ and ⅔ of the length of the gradient coil system, of the gradient coils.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a magnetic resonance apparatus having at least one gradient coil attached to a holder, said gradient coil exhibiting at least one vibratory node along a longitudinal length of said gradient coil during operation of said magnetic resonance apparatus, the improvement comprising:

said gradient coil being attached to said holder exclusively in a region of said vibratory node.

2. The improvement of claim 1 further comprising a damping element securing said gradient coil to said holder.

3. The improvement of claim 1 wherein said gradient coil is attached to said holder in a region between ⅓ and ⅔ of said longitudinal length.

4. The improvement of claim 1 wherein said magnetic resonance apparatus has a gradient coil system including said gradient coil and a plurality of other gradient coils, said gradient coil system exhibiting a vibratory node along a longitudinal length thereof during operation of said magnetic apparatus, and said gradient coil system being secured to said holder exclusively in a region of said vibratory node of said gradient coil system.

5. A method for reducing noise during operation of a magnetic resonance apparatus comprising:

providing a holder;

providing at least one gradient coil which exhibits a vibratory node during operation of said magnetic resonance apparatus; and attaching said at least one gradient coil to said holder exclusively in a region of said vibratory node.

* * * * *